(12) United States Patent
Lin et al.

(10) Patent No.: US 6,905,977 B2
(45) Date of Patent: Jun. 14, 2005

(54) METHOD OF IMPROVING ELECTROLUMINESCENT EFFICIENCY OF A MOS DEVICE BY ETCHING A SILICON SUBSTRATE THEREOF

(75) Inventors: Ching Fuh Lin, Taipei (TW); Wu Ping Huang, Taipei (TW); Hsing Hung Hsieh, Taipei (TW); Eih Zhe Liang, Taipei (TW)

(73) Assignee: National Taiwan University, Taipei (TW)

( * ) Notice: Subject to any disclaimer, the term of this patent is extended or adjusted under 35 U.S.C. 154(b) by 119 days.

(21) Appl. No.: 10/396,448

(22) Filed: Mar. 26, 2003

(65) Prior Publication Data

US 2004/0188694 A1 Sep. 30, 2004

(51) Int. Cl.$^7$ .............................................. H01L 21/302
(52) U.S. Cl. ......................................... 438/753; 438/29
(58) Field of Search ............................. 438/22–47, 753

(56) References Cited

U.S. PATENT DOCUMENTS

| | | | | |
|---|---|---|---|---|
| 4,838,950 A | * | 6/1989 | Ramaprasad | 136/244 |
| 5,110,755 A | * | 5/1992 | Chen et al. | 438/409 |
| 5,420,049 A | * | 5/1995 | Russell et al. | 438/22 |
| 6,276,207 B1 | * | 8/2001 | Sakai et al. | 73/514.16 |

OTHER PUBLICATIONS

Wolf; Silicon Processing for the VLSI Era vol. 1: Process Technology; 1986; Lattice Press, Sunset Beach, California; pp. 531.*

Jaeger; Introduction to Microelectronic Fabrication; Modular Series on Solid State Devices, vol. 5; 1988; Addison–Wesley Publishing Company, Reading, Massachusetts; pp. 14–16.*

Lin; SiO2–Nanoparticles Enhancing Si Band–Edge Electroluminescence to Nearly Lasing Actions; Nanotechnology, 2001; IEEE–NANO 2001; Proceedings of the 2001 1st IEEE Conference on Oct. 28–30, 2001; pp. 358–362.*

* cited by examiner

*Primary Examiner*—Howard Weiss
*Assistant Examiner*—Marcos D. Pizarro-Crespo
(74) *Attorney, Agent, or Firm*—Rosenberg, Klein & Lee

(57) ABSTRACT

The present invention discloses a method of improving an electroluminescent efficiency of a MOS device by etching a semiconductor substrate thereof. A chemical etching process is performed to remove surface states or surface defects located on the surface of a silicon substrate before a nanoparticle layer and a conducting layer is formed on the silicon substrate, in order that the non-radiative electron-hole recombination centers located on the surface of silicon substrate is suppressed. Accordingly, the percentage of radiative electron-hole recombination is heightened and the electroluminescent efficiency of a MOS light emitting device is drastically enhanced. Advantageously, the chemical etching step is able to create a nanostructure on the surface of the silicon substrate to increase the probability of the collision of electron-hole pairs and phonons, and the electroluminescent efficiency of a MOS light emitting device is improved as well.

17 Claims, 7 Drawing Sheets

METHOD OF IMPROVING ELECTROLUMINESCENT EFFICIENCY OF A MOS DEVICE BY ETCHING A SILICON SUBSTRATE THEREOF

FIELD OF THE INVENTION

The present invention is related to a method of producing a metal-oxide-silicon light emitting diode (MOSLED), and in particular to a method of improving an electroluminescent efficiency of a MOS device by etching a silicon substrate thereof.

BACKGROUND OF THE INVENTION

The renowned metal-oxide-silicon (MOS) device was set forth by Moll, Pfann and Garrett at 1959 as an epoch-making innovation. MOS device was originally designed for producing voltage-controlled capacitors. In 1970s, Boyle and Smith first put through a new concept of charge-coupling and thus made a charge-coupled device (CCD), which has become a crucial component in a digital still camera. In 1980s, MOS device has been widely used as a key element in integrated circuits (ICs). A CMOS (complementary metal-oxide-semiconductor) device that is comprised of an n-channel MOSFET (metal-oxide-semiconductor field-effect transistor) and a p-channel MOSFET plays a significant role in a very-large scaled integrated (VLSI) circuit or an ultra-large scaled integrated (ULSI) circuit. Consider the application of a solar cell, great importance is still attached to the known MOS device that makes the MOS device become a high-valued component.

Although the MOS device plays an extremely important role in microelectronic circuits, its application in light-emitting display device is not highly expected. This is because silicon is an indirect bandgap semiconductor, and the electroluminescent radiation which is carried out by the recombination process of electrons and holes requires the participation of phonons such that the momentum conservation principle can be satisfied. Under ordinary conditions, the probability in which electrons, holes and phonons collide with each other simultaneously is little, and thus the probability of the recombination of electrons and holes and also the possibility of the generation of electroluminescent radiation are quite insignificant. This narrows the prospect of the MOS device in the application of electroluminescent display device.

To conquer the foregoing weakness, a MOS light emitting diode (MOSLED) using nanoparticles and nanostructures is innovated that enhances the electroluminescent efficiency thereof by loosening the restrictions imposed by the indirect bandgap of silicon. The fundamental principle of the MOS light emitting diode is to utilize the tunneling effect based on the quantum mechanics. It is appreciated by applying the calculating formulas according to the quantum mechanics that the probability of the occurrence of the electron tunneling effect will be drastically increased as the thickness of the oxide is downscaled to the degree of several nanometers. This tunneling effect will be directly proportional to the forward-biased voltage applied to the MOS device. However, since silicon dioxide is not a conductor after all, a- non-negligible voltage will be present across the oxide layer. That is, the metal layer and the oxide layer are suffering different voltages, which in turn cause the energy band of silicon to bend. In case of a N-type silicon, the energy band of silicon in the proximity of silicon-oxide interface will bend downward under a forward-biased condition (a positive voltage is applied to the metal layer and a negative voltage is applied to the oxide layer), and thus form a potential well that collects a large number of electrons hereabouts. Meanwhile a large number of holes travels from the metal layer by way of tunneling effect to this potential well collecting a large number of electrons, so that a large number of electrons and holes are allowed to be recombined hereabouts and the electron-hole pair can be easily collided with phonons to make electroluminescent radiation. In case of a P-type silicon, the fundamentals of electroluminescent radiation and the generation of photons can be deduced by an analogous way with those of a N-type silicon.

However, because the electroluminescent radiation of the MOS light emitting diode is taken place at the surface of a silicon substrate, the recombination of electrons and holes is inevitably influenced by non-radiative recombination centers. These non-radiative recombination centers generally include impurities, defects, and surface states, and they are enabled to lower the percentage of radiative recombination. These non-radiative recombination centers referred herein provides an additional approach for electrons and holes to be recombined, and the lifetime of carrier including electrons and holes is significantly reduced because of the participation of these non-radiative recombination centers. Hence, if it is desired to improve an electroluminescent efficiency of a MOS light emitting device, the extent of non-radiative recombination centers has to be reduced and thus the percentage of radiative recombination can be enhanced.

In view of the foregoing, a plenarily innovative technique of producing a MOS light emitting device and improving an electroluminescent efficiency of a MOS light emitting device by etching a silicon substrate thereof is disclosed, which is possible to loosen the restrictions imposed by the indirect energy bandgap of silicon and improve the electroluminescent efficiency of the MOS light emitting device efficiently.

SUMMARY OF THE INVENTION

A primary object of the present invention is focused on a method of improving an electroluminescent efficiency of a MOS device by etching a silicon substrate thereof, which is enabled to suppress non-radiative electron-hole recombination centers and heighten the percentage of the radiative electron-hole recombination without being restricted by the restrictions imposed by the indirect energy bandgap of silicon.

Another object of the present invention is to provide a method of improving an electroluminescent efficiency of a MOS light emitting device by etching a silicon substrate thereof, wherein the method according to the present invention is advantageous in that a nanostructure can be deposited over the surface of the silicon substrate in the course of the manufacturing process of a MOS light emitting device. This nanostructure is capable of confining electrons and holes within a nano-degree region in order to heighten the probability of collisions of electrons and holes, and in this manner the electroluminescent efficiency of the MOS light emitting device is improved.

A further object of the present invention is to provide a method of improving an electroluminescent efficiency of a MOS light emitting device by etching a silicon substrate thereof, which employs a full-grown manufacturing process and equipment currently used in a semiconductor production line, so that the method according to the present invention is advantageous in terms of simplified manufacturing process, inexpensive manufacturing cost and the ability of direct integration with IC manufacturing industry.

To these ends, the present invention uses an etching solution having a high concentration to etch the surface of a clean silicon substrate in order to remove non-radiative recombination centers located on the surface of the silicon substrate and deposit a nanostructure thereon. Next, the silicon substrate is cleaned up again and a nanoparticle layer and a conducting layer are formed on the top of the surface of the silicon substrate, thereby complete the manufacturing of a MOS light emitting device.

The features and advantages of the present invention will become more apparent through the following descriptions with reference to the accompanying drawings, in which:

DETAILED DESCRIPTION OF THE PREFERRED EMBODIMENT

The present invention is based on the knowledge of etching a silicon substrate pertaining to a MOS light emitting device to allow the MOS light emitting device to efficiently produce photons by electroluminescent radiation, with a result that an electroluminescent efficiency of the MOS device is drastically improved.

The recombination of electrons and holes is influenced in terms of several non-radiative recombination centers such as impurities, surface defects and surface states, which significantly lower the percentage of radiative recombination. Furthermore, the lifetime of carriers including electrons and holes is significantly shortened because of the participation of these non-radiative recombination centers. The lifetime of carriers may be represented by the following equation:

$$\frac{1}{\tau} = \frac{1}{\tau_r} + \frac{1}{\tau_d} + \frac{1}{\tau_i} + \frac{1}{\tau_s} + \ldots$$

where $$\frac{1}{\tau_r}$$

stands for the radiative recombination centers, $$\frac{1}{\tau_d}$$

stands for the influence caused by the defects in the non-radiative recombination centers, $$\frac{1}{\tau_i}$$

stands for the impurities in the non-radiative recombination centers, and $$\frac{1}{\tau_s}$$

stands for the surface states in the non-radiative recombination centers. It can be understood from the above equation that all the non-radiative recombination centers are contributory to the shortening of carrier lifetime. Taking a silicon substrate into consideration, it is detected from experimental measurements that the lifetime of carriers in a CZ silicon substrate is limited within 10 $\mu$s, whereas the lifetime of carriers in a FZ silicon substrate is as high as 60 $\mu$s, even can be higher as 1 ms. It can be clearly seen that the non-radiative recombination centers are indeed influential in the additional recombination of electrons and holes.

Because the electroluminescent radiation of the MOS light emitting device is taken place at the surface of the silicon substrate, it will be greatly influenced by surface states and surface defects of the silicon substrate. It is observed from experimental measurements on the carrier lifetime that the carrier lifetime will be 1 ms if there is no surface state and surface defects existing on the silicon substrate (that is, inside the crystallization); however, the carrier lifetime will be shortened to 60 $\mu$s under the influence of surface state. In view thereof, if the surface of a silicon substrate can be pre-processed by an erosive step, for example a chemical etching process in order to abate the influence of surface states and surface defects prior to the manufacturing process of a MOS light emitting device, the electroluminescent efficiency of a MOS light emitting device formed thereby can be improved.

Figure 1A:
FIGS. 1(a) to 1(d) are cross-sectional views which demonstrate each step involved in the production of a MOS light emitting device according to the present invention.
Figure 1B:
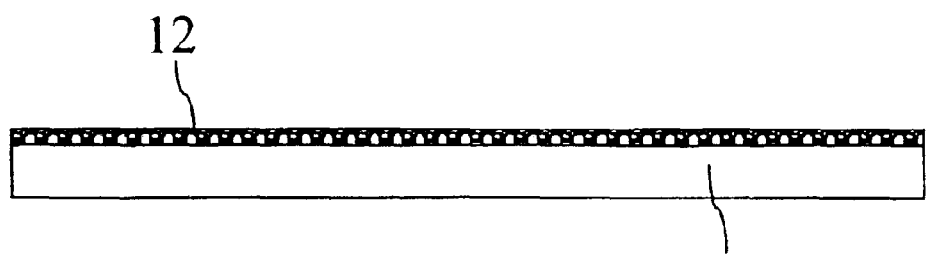

FIGS. 1(a) to 1(d) are cross-sectional views which demonstrate each step involved in the production of a MOS light emitting device according to the present invention. As shown in these drawings, a silicon substrate 10 is provided. As indicated in FIG. 1(a), the silicon substrate 10 is cleaned up through a standard semiconductor cleaning procedure. Next, an etching solution such as a potassium hydroxide (KOH) solution, a sodium hydroxide (NaOH) solution, or a Tetramethylammonium Hydroxide (TMAH) solution having a high concentration is used to perform a chemical etching process to the silicon substrate 10. The etching time lapsed in the chemical etching process is determined by the concentration of the etching solution, preferably it is limited between 10 and 40 seconds, and the etching depth is less than 50 nm. By using this chemical etching process, the non-radiative recombination centers located at the surface of the silicon substrate 10 are removed and a nanostructure is deposited atop the silicon substrate 10. After the chemical etching process is completed, the silicon substrate 10 is cleaned again by deionized water and dried.

Figure 1C:
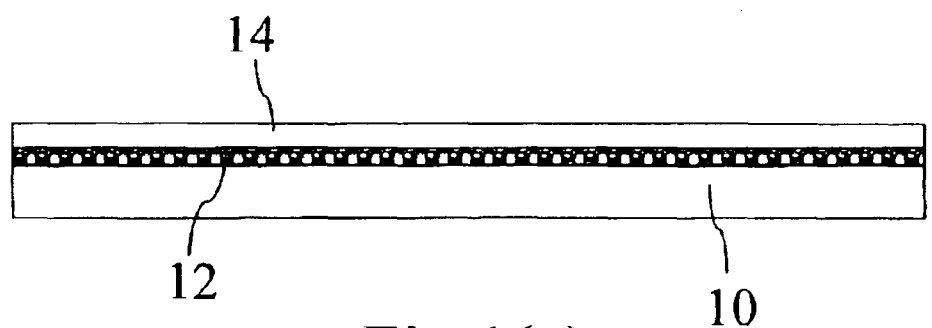
Figure 1D:
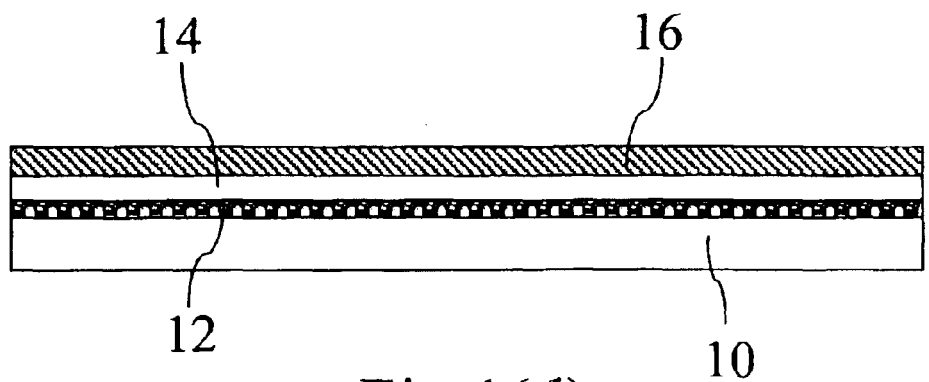

Hereinafter, a silicon dioxide nanoparticle solution is provided and diluted in order to lower the concentration of nanoparticles, and the diluted silicon dioxide nanoparticle solution is deposited atop the silicon substrate 10 by a spin coating process and thereby form a nanoparticle layer 12 atop the silicon substrate 10. The silicon substrate 10 together with the nanoparticle layer 12 deposited thereon is dried and the residual organic solvents are removed. Subsequently, as shown in FIG. 1(c) a thin aluminum oxide layer 14 is coated onto the nanoparticle layer 12 by an evaporation process, and then the oxide layer 14 is plated with silver or silver paint in order to form a conducting layer 16 atop the oxide layer 14, as shown in FIG. 1(d). So far the manufacturing process of a MOS light emitting device according to the present invention is accomplished.

The constitutor of the above-mentioned silicon substrate 10 can be flexibly selected from one of a group consisting of germanium, silicon germanium, silicon carbide, or other indirect bandgap semiconductor material. On the other hand, in the step of etching the silicon substrate 10, the etching process can be performed by not only a chemical etching step but a gas etching step or an ion etching step.

The distinction of the manufacturing process of the MOS light emitting device according to the present invention is characterized by using an etching solution such as a potassium hydroxide (KOH) solution to etch a silicon substrate 10. The etching process on the silicon substrate 10 is started from the surface of silicon substrate 10 that allows the etching solution to remove the surface states and surface defects from the silicon substrate 10, but protects the well-defined crystalline portion of the silicon substrate 10 from etching within an appropriate etching time. Further, the etching time is determined by the concentration of the etching resolution, but a preferred determination of the etching time is made on the basis of removing the surface states and surface defects from the silicon substrate 10 while protecting the well-defined crystalline portion of the silicon substrate 10 from etching.

Thus far, the spirits of the present invention has been fully described. It is intended to particularly testify the above-described fundamental theorems by giving several preferred embodiments, and those having an ordinary skill in the art would assimilate enough knowledge through the descriptions of the following preferred embodiments and accomplish the present invention in view of the above.

Figure 2:
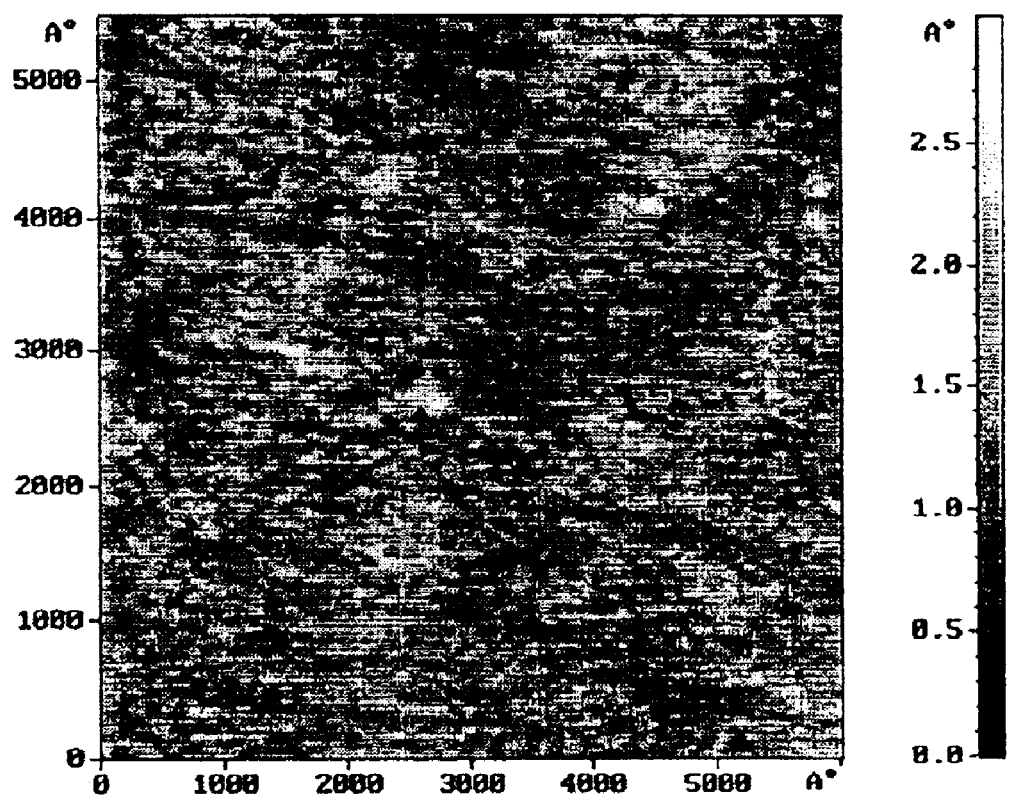
FIG. 2 shows an atomic force microscope (AFM) photo of a silicon substrate before chemical etching.
Figure 3:
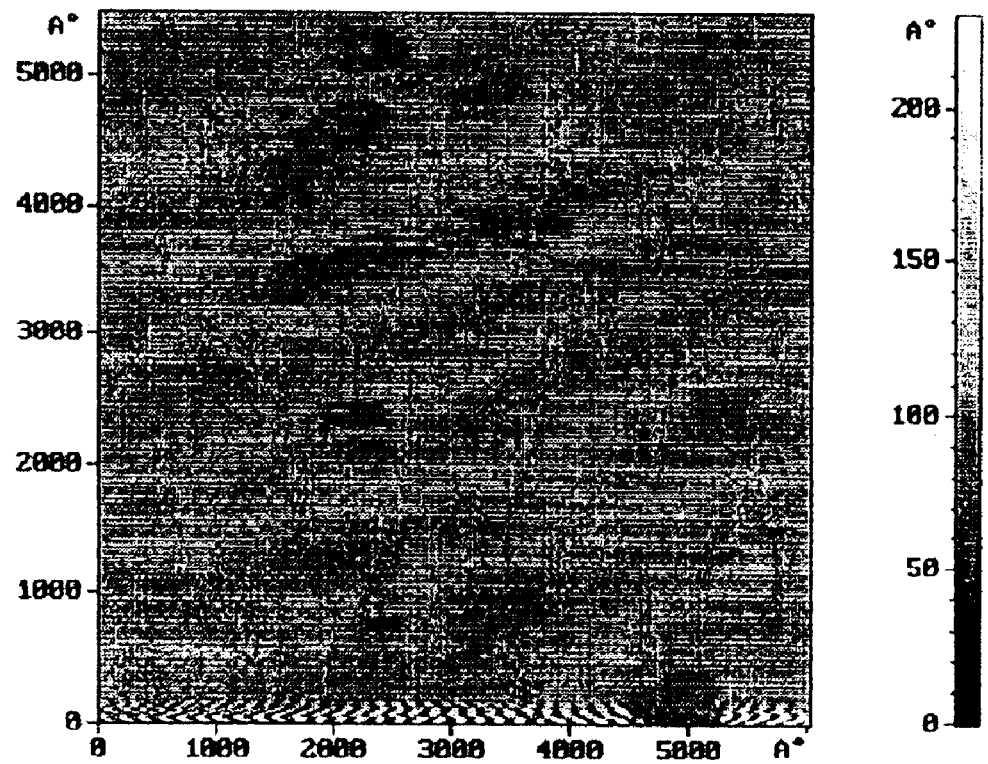
FIG. 3 shows an atomic force microscope (AFM) photo of a silicon substrate after chemical etching.

First, a potassium hydroxide (KOH) solution having a weight concentration of 45% is used to etch a silicon substrate with an etching time being 30 seconds. The comparison between a silicon substrate before etching and a silicon substrate after etching is given in FIGS. 2 and 3, which shows the atomic force microscope (AFM) photos of a silicon substrate before etching and after etching, respectively. As shown in FIG. 2, the surface of silicon substrate before etching is quite flat and even, and the difference in height is estimated within several angstroms. After etching, a portion of the surface of the silicon substrate is etched off so that a portion of the etched silicon substrate are deeper in depth to the extent of around 100 angstroms, as shown in FIG. 3. However, there is still another portion of the silicon substrate being flat and even without being etched in the chemical etching process. This situation is possible because the effect of the chemical etching process is taken initially from the weakest point of the lattice structure of the silicon substrate, and these weakest points are where the lattice defects are present and where the outside atoms impose its influence on (that is where the surface states are aggregated). The portion of the silicon substrate being etched by the chemical etching process are exactly located at where the surface states or surface defects are aggregated. As long as the portion of silicon substrate where the surface states or surface defects are aggregated is etched, the non-radiative recombination centers will be suppressed due to the reasons described above. As a result, the percentage of radiative recombination is heightened and the electroluminescent efficiency of a MOS light emitting device is increased.

Chemical etching is capable of not only removing surface states or surface defects but create nanostructure atop the silicon substrate. This nanostructure is sufficient to confine electrons and holes within a nano-degree region. Phonons can easily take part in the recombination process since electrons and holes have been collected together. That is to say, the conventional recombination process that requires three kinds of particles—electrons, holes and phonons to take part in the trilateral collision is changed to a new situation that requires two kinds of particles—electron-hole pairs and photons to take part in the bilateral collision for creating electroluminescent radiation. In this manner, the probability of the occurrence of particle collision is significantly increased and an electroluminescent efficiency of a MOS light emitting device is increased as well.

Figure 4:
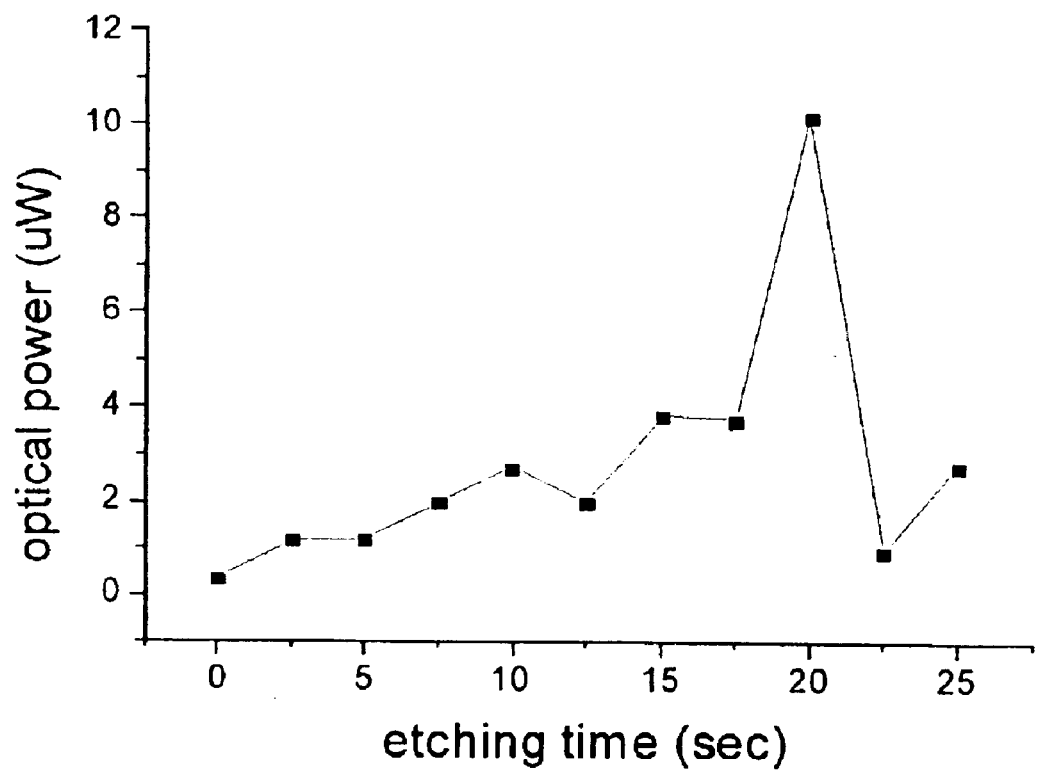
FIG. 4 illustrates the influence on the electroluminescent efficiency of a MOS light emitting device caused by an etching time of the chemical etching process using a potassium hydroxide (KOH) solution as an etching solution.

Referring to FIG. 4, the influence on the electroluminescent efficiency of a MOS light emitting device caused by an etching time of the chemical etching process using a potassium hydroxide (KOH) solution as an etching solution is depicted. It can be easily observed from FIG. 4 that an appropriate etching time is beneficial to the improvement of electroluminescent efficiency of a MOS light emitting device, however, as long as the etching time gets prolonged, it will bring harm to the flat and even portion of the silicon substrate, so that the etching time should be avoid becoming overlong.

Figure 5:
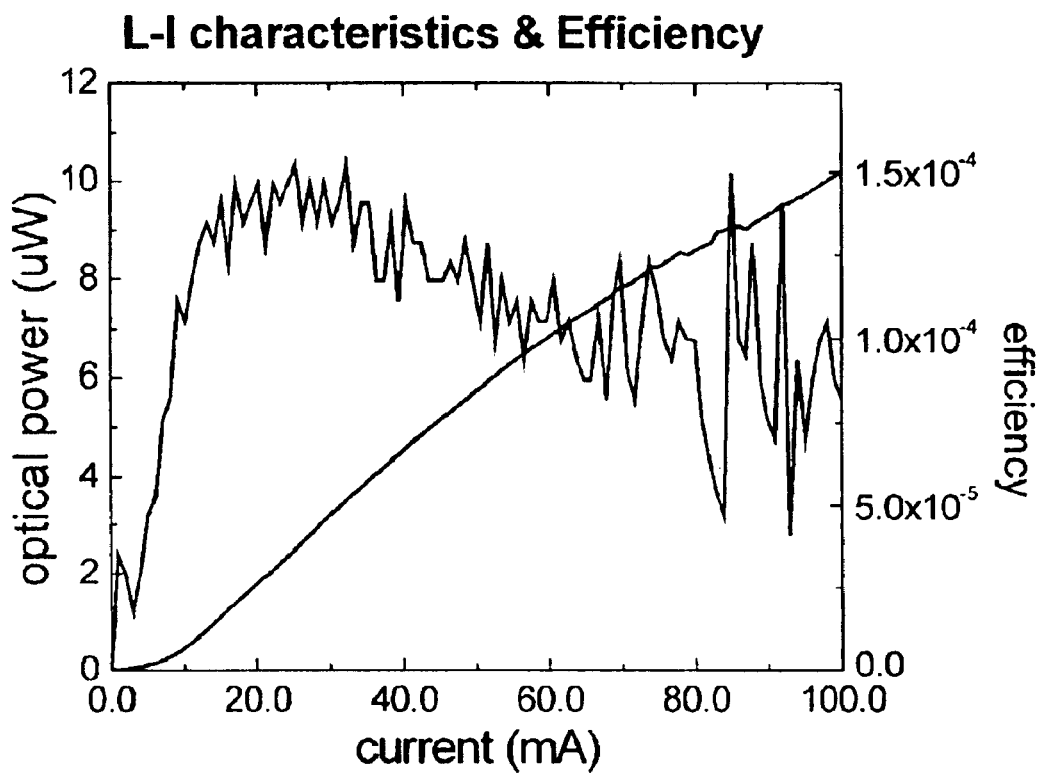
FIG. 5 is a plot showing a characteristic relationship between the optical power and the injection current with respect to the electroluminescent efficiency, in which the red curve indicates the characteristic relationship between the optical power and the injection current, and the blue curve indicates the characteristic relationship between the electroluminescent efficiency and the injection current.
Figure 6:
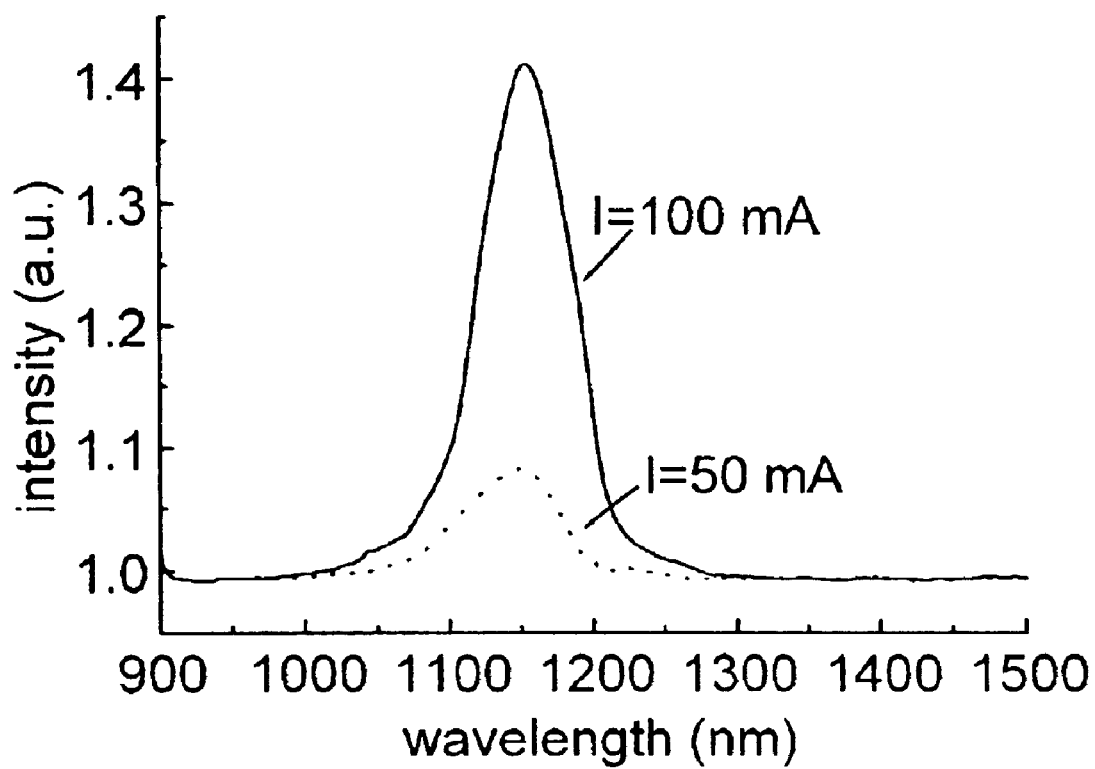
FIG. 6 shows a luminescence spectrum of a MOS light emitting device according to the present invention.

Next, as shown in FIG. 5, the characteristic relationship between the optical power and the injection current with respect to the electroluminescent efficiency is illustrated, in which the gradually rising curve indicates the characteristic relationship between the optical power and the injection current, and the other curve indicates the characteristic relationship between the electroluminescent efficiency. In FIG. 5, it reveals that if the injection current is rated at 100 mA, the output optical power is rated at 10 $\mu$W, and when the injection current is rated at 100 mA, the corresponding electroluminescent efficiency exceeds $10^{-4}$. However, the calculation of the optical power is made by taking the part of the radiation being emitted from the edge of silver paint into consideration only. Actually, most of the radiation is either masked by the silver paint or emitted from elsewhere, and is not able to be collected by a photodetector. In other words, the actual electroluminescent efficiency may reach up to $10^{-3}$. FIG. 6 shows a luminescence spectrum of a MOS light emitting device according to the present invention. It can be seen from the luminescence spectrum of FIG. 6 that the electroluminescent radiation is induced by the electron-hole recombination instead of impurities, and it is beyond doubt that the chemical etching process does not give any assistance in the increment of surface states.

Figure 7:
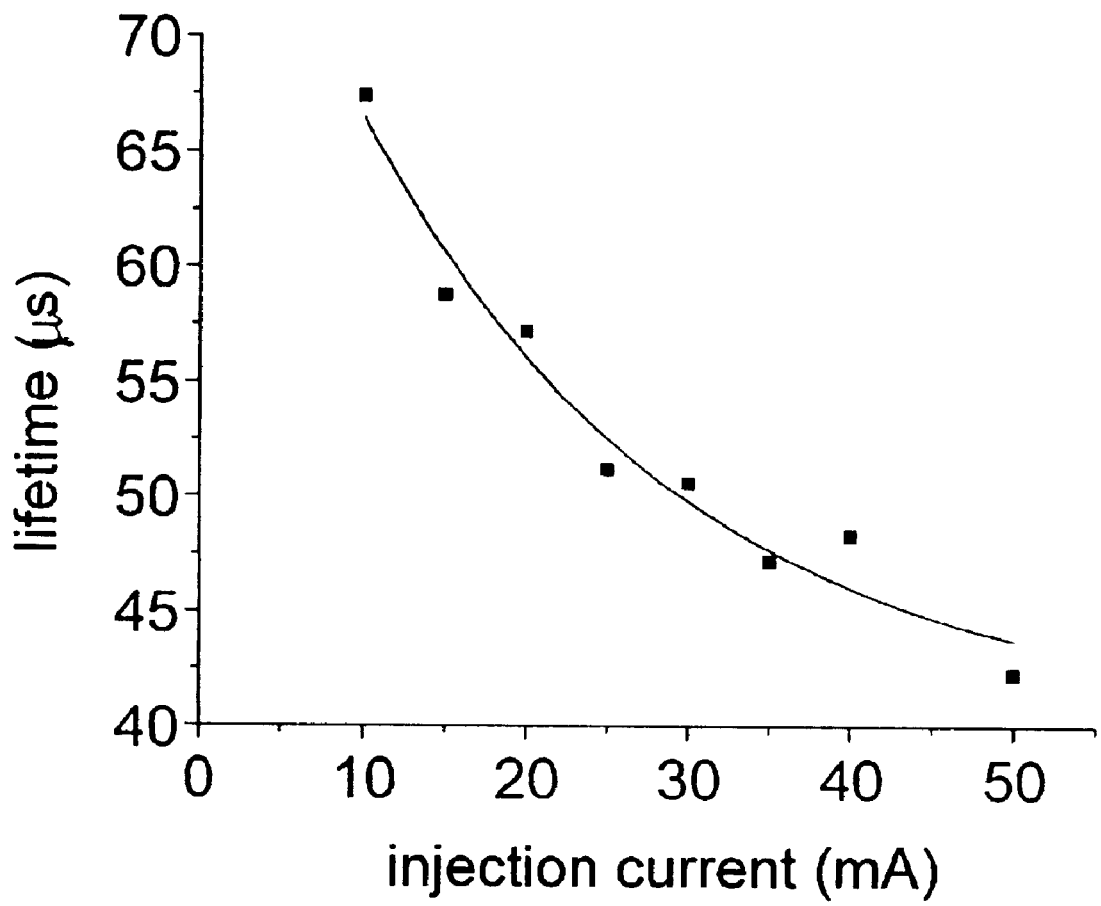
FIG. 7 is a plot showing a characteristic relationship between the lifetime of carrier and the injection current.

It is realized from the experimental measurements on the lifetime of carriers (electrons, holes) that the carrier lifetime will be shortened if the injection current is increased. As illustrated in FIG. 7, the lifetime of carriers that are to be non-radiatively recombined will not be affected by the injection current, while the lifetime of carriers that are to be radiatively recombined will be shortened under the influence of the injection current. The distinct shortening of carrier lifetime denotes that the radiative recombination plays an important role in the electroluminescent radiation emitted from a MOS device. In addition, if the injection current is zero, the carrier lifetime will be calculated as 80 μs by using an extrapolation algorithm. It indicates that the non-radiative recombination is greatly suppressed with the aid of chemical etching process, and the electroluminescent efficiency of a MOS light emitting device is significantly improved.

As such, the present invention is able to reduce the non-radiative electron-hole recombination centers located on the surface of a silicon substrate substantially, and at the same time the percentage of radiative electron-hole recombination is heightened. The utilization of a MOS light emitting device will no longer be restricted from the indirect bandgap of silicon, and the performance of electroluminescent efficiency of a MOS light emitting device is scaled up greatly. More specifically, because the manufacturing process of the MOS light emitting device according to the present invention is quite similar in nature with the manufacturing process of the conventional MOS light emitting device, and both of them are integrated on a silicon chip, the MOS light emitting device according to the present invention can be compatibly combined with the current integrated circuits in its entirety. This allows the silicon chip to be applicable to electronic products as well as high-efficiency light emitting device. The monolithic integration of electronic chip and light emitting device is capable of expanding the application territory of silicon chip and silicon material. Further, the structure and manufacturing process of the MOS light emitting device according to the present invention is quite simple and bears a low cost, so that it can be integrated with the current IC industry without effort and thus raise its practicability.

While the present invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A method of improving an electroluminescent efficiency of a MOS device by etching a silicon substrate thereof, comprising steps of:
    providing a clean silicon substrate;
    etching the silicon substrate with an etching solution having an appropriate concentration to etch the silicon substrate in order to remove or suppress non-radiative recombination centers located on a surface of the silicon substrate and form a nanostructure on the silicon substrate, thereby enhancing probability of limiting electrons and holes between the nanostructure and increasing a probability of radiative recombination of electrons and holes, an etching time for the silicon substrate being limited to prevent etching a well-defined crystalline portion of the silicon substrate;
    depositing a nanoparticle layer on the silicon substrate; and
    forming a conducting layer to overlay the nanoparticle layer.

2. The method of improving an electroluminescent efficiency of a MOS device according to claim 1 wherein the clean silicon substrate is attained by cleaning up a silicon substrate through a semiconductor cleaning process.

3. The method of improving an electroluminescent efficiency of a MOS device according to claim 1 wherein the etching solution is one selected from a group consisting of a potassium hydroxide solution, a sodium hydroxide solution, and a Tetramethylammonium Hydroxide (TMAH) solution.

4. The method of improving an electroluminescent efficiency of a MOS device according to claim 1 wherein the etching time lapsed in etching the silicon substrate is determined by the concentration of the etching solution.

5. The method of improving an electroluminescent efficiency of a MOS device according to claim 1 wherein an etching depth on the silicon substrate is less then 50 nanometers.

6. The method of improving an electroluminescent efficiency of a MOS device according to claim 1 wherein a dimension of the nanostructure is limited between 1 and 300 nanometers.

7. The method of improving an electroluminescent efficiency of a MOS device according to claim 1 wherein the nanoparticle layer is formed by a spin coating process.

8. The method of improving an electroluminescent efficiency of a MOS device according to claim 1 wherein the nanoparticle layer is formed from silicon dioxide nanoparticles.

9. The method of improving an electroluminescent efficiency of a MOS device according to claim 1 wherein the step of etching the silicon substrate is performed by a chemical etching step, a gas etching step, or an ion etching step.

10. The method of improving an electroluminescent efficiency of a MOS device according to claim 1 wherein the non-radiative recombination centers located on the surface of the silicon substrate comprises impurities, surface defects, and surface states.

11. The method of improving an electroluminescent efficiency of a MOS device according to claim 1 wherein after the nanostructure is deposited on the silicon substrate, the silicon substrate is further cleaned by a deionized water.

12. The method of improving an electroluminescent efficiency of a MOS device according to claim 1 wherein after the nanostructure is deposited on the silicon substrate, the method further comprising steps of drying the silicon substrate and removing an organic solvent from the silicon substrate.

13. The method of improving an electroluminescent efficiency of a MOS device according to claim 1 wherein the conducting layer is formed by an evaporation process.

14. The method of improving an electroluminescent efficiency of a MOS device according to claim 1 wherein the conducting layer is formed from silver or silver paint.

15. The method of improving an electroluminescent efficiency of a MOS device according to claim 1, further comprising the step of forming an aluminum oxide layer on the nanoparticle layer prior to forming the conducting layer.

16. The method of improving an electroluminescent efficiency of a MOS device according to claim 1 wherein the etching time lapsed in etching the silicon substrate is limited between 10 and 40 seconds.

17. The method of improving an electroluminescent efficiency of a MOS device according to claim 16 wherein the etching time lapsed in etching the silicon substrate is determined by the concentration of the etching solution.

* * * * *